(12) United States Patent
Son et al.

(10) Patent No.: US 12,171,080 B2
(45) Date of Patent: Dec. 17, 2024

(54) COVER OF ELECTRONIC DEVICE, AND METHOD FOR MANUFACTURING SAME

(71) Applicant: Samsung Electronics Co., Ltd., Suwon-si (KR)

(72) Inventors: Kyoungdon Son, Suwon-si (KR); Poonggi Jung, Suwon-si (KR); Sejin Kim, Suwon-si (KR); Hakju Kim, Suwon-si (KR); Jindeuk Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 17/896,733

(22) Filed: Aug. 26, 2022

(65) Prior Publication Data

US 2022/0408581 A1 Dec. 22, 2022

Related U.S. Application Data

(63) Continuation of application No. PCT/KR2020/015243, filed on Nov. 3, 2020.

(30) Foreign Application Priority Data

Mar. 11, 2020 (KR) .................. 10-2020-0030341

(51) Int. Cl.
*H05K 5/03* (2006.01)
*B24B 29/00* (2006.01)
(Continued)

(52) U.S. Cl.
CPC ............... *H05K 5/03* (2013.01); *B24B 29/00* (2013.01); *C03B 23/03* (2013.01); *C03C 17/002* (2013.01); *C03C 2218/119* (2013.01)

(58) Field of Classification Search
CPC .......... H05K 5/03; B24B 29/00; C03B 23/03; C03C 17/002; C03C 2218/119
See application file for complete search history.

(56) References Cited

U.S. PATENT DOCUMENTS

| 8,192,253 B2 | 6/2012 | Seo et al. |
| 10,299,396 B2 | 5/2019 | Dejneka et al. |

(Continued)

FOREIGN PATENT DOCUMENTS

| JP | 2003-260647 A | 9/2003 |
| JP | 2009-255373 A | 11/2009 |

(Continued)

OTHER PUBLICATIONS

JP2009-255373A Machine Translation via EPO (Year: 2009).*
Korean Office Action Feb. 21, 2024, issued in Korean Application No. 10-2020-0030341.

*Primary Examiner* — Laura C Powers
(74) *Attorney, Agent, or Firm* — Jefferson IP Law, LLP

(57) ABSTRACT

A rear cover of an electronic device is provided. The rear cover includes a glass substrate including a first face facing a first direction, a second face facing a second direction opposite to the first direction, and at least one side face disposed between the first face and the second face, a roughness layer formed on the first face and having a first roughness, a hairline pattern formed on the roughness layer and having a second roughness, and a hard coating layer formed on the roughness layer and the hairline pattern.

9 Claims, 13 Drawing Sheets

(51) Int. Cl.
*C03B 23/03* (2006.01)
*C03C 17/00* (2006.01)

(56) References Cited

U.S. PATENT DOCUMENTS

| | | | |
|---|---|---|---|
| 10,691,169 B2 | 6/2020 | Mylvaganam et al. | |
| 2012/0026666 A1* | 2/2012 | Crooijmans | G06F 1/1626 |
| | | | 361/679.26 |
| 2014/0100005 A1 | 4/2014 | Bae et al. | |
| 2018/0054904 A1* | 2/2018 | Dejneka | B44F 1/10 |
| 2020/0045153 A1* | 2/2020 | Xie | H04M 1/0266 |

FOREIGN PATENT DOCUMENTS

| | | | |
|---|---|---|---|
| JP | 2013-091191 A | 5/2013 | |
| KR | 10-2011-0069462 A | 6/2011 | |
| KR | 10-2014-0044996 A | 4/2014 | |
| KR | 20-2017-0001239 U | 4/2017 | |
| KR | 10-2019-0039268 A | 4/2019 | |

\* cited by examiner

COVER OF ELECTRONIC DEVICE, AND METHOD FOR MANUFACTURING SAME

CROSS-REFERENCE TO RELATED APPLICATION(S)

This application is a continuation application, claiming priority under § 365(c), of an International application No. PCT/KR2020/015243, filed on Nov. 3, 2020, which is based on and claims the benefit of a Korean patent application number 10-2020-0030341, filed on Mar. 11, 2020, in the Korean Intellectual Property Office, the disclosure of which is incorporated by reference herein in its entirety.

BACKGROUND

1. Field

The disclosure relates to a cover of an electronic device. More particularly, the disclosure relates to a surface texture structure of a rear cover.

2. Description of Related Art

An electronic device may include a front face and a rear face. A front camera and a display may be disposed to the front face, and at least one or more rear cameras and an illumination device may be disposed to the rear face. Such an electronic device may include front and rear covers which serve as part of an exterior. The front cover and the rear cover may be constructed of, for example, a metallic material of a thin plate shape, among various materials.

Various textures may be represented on this metal cover. For example, various patterns/designs may be represented on the cover, and a die casting technique may be used to represent the various patterns/designs.

SUMMARY

However, there may be inconveniences and difficulties in a process of adjusting a blasting injection distance, pressure, and time to realize various textures in a cover constructed of a metallic material.

Aspects of the disclosure are to address at least the above-mentioned problems and/or disadvantages and to provide at least the advantages described below. Accordingly, an aspect of the disclosure is to provide a cover capable of forming a hairline pattern in a front face and/or rear face of a glass material, and a manufacturing method thereof.

Another aspect of the disclosure is to provide a cover capable of forming a hairline pattern in a front face of a glass substrate in a three dimension (3D) shape, and a manufacturing method thereof.

Another aspect of the disclosure is to provide a cover capable of suppressing light leakage through a glass substrate by applying a light leakage suppressing layer on a side face of the glass substrate, and a manufacturing method thereof.

In accordance with an aspect of the disclosure, a rear cover of an electronic device is provided. The rear cover includes a glass substrate including a first face facing a first direction, a second face facing a second direction opposite to the first direction, and at least one side face disposed between the first face and the second face, a roughness layer formed on the first face and having a first roughness, a hairline pattern formed on the roughness layer and having a second roughness, and a hard coating layer formed on the roughness layer and the hairline pattern.

In accordance with another aspect of the disclosure, an electronic device is provided. The electronic device includes a housing having at least one cover. The cover may include a glass substrate including a first face facing a first direction, a second face facing a second direction opposite to the first direction, and at least one side face disposed between the first face and the second face, and including a flat portion including at least one edge and a curved portion extended from the edge of the flat portion, a roughness layer formed on the first face and having a first roughness, a hairline pattern formed on the roughness layer and having a second roughness, and a hard coating layer formed on the roughness layer and the hairline pattern.

In accordance with another aspect of the disclosure, a method of manufacturing a cover of an electronic device is provided. The method includes a first operation of preparing a two dimension (2D) glass including a first face facing a first direction and a second face facing a second direction opposite to the first direction, a second operation of performing blasting surface treatment on the first face of the 2D glass by using a first fine metal particle, a third operation of forming a hairline pattern on the blasted first face of the 2D glass by using a sandpaper, a fourth operation in which the 2D glass having the hairline pattern realized thereon is formed into a 3D glass through thermoforming, a fifth operation of performing blasting surface treatment on a first face of the 3D glass by using a second fine metal particle, a sixth operation of polishing a second face of the 3D glass, and a seventh operation of coloring the polished second face of the 3D glass.

According to various embodiments of the disclosure, it is possible to realize a hairline texture effect on a substrate constructed of a glass material.

According to various embodiments of the disclosure, it is possible to suppress light leakage through a side face of a glass substrate.

According to various embodiments of the disclosure, various color representations are possible by attaching a film to a bottom face of a glass substrate.

DETAILED DESCRIPTION

Figure 1:
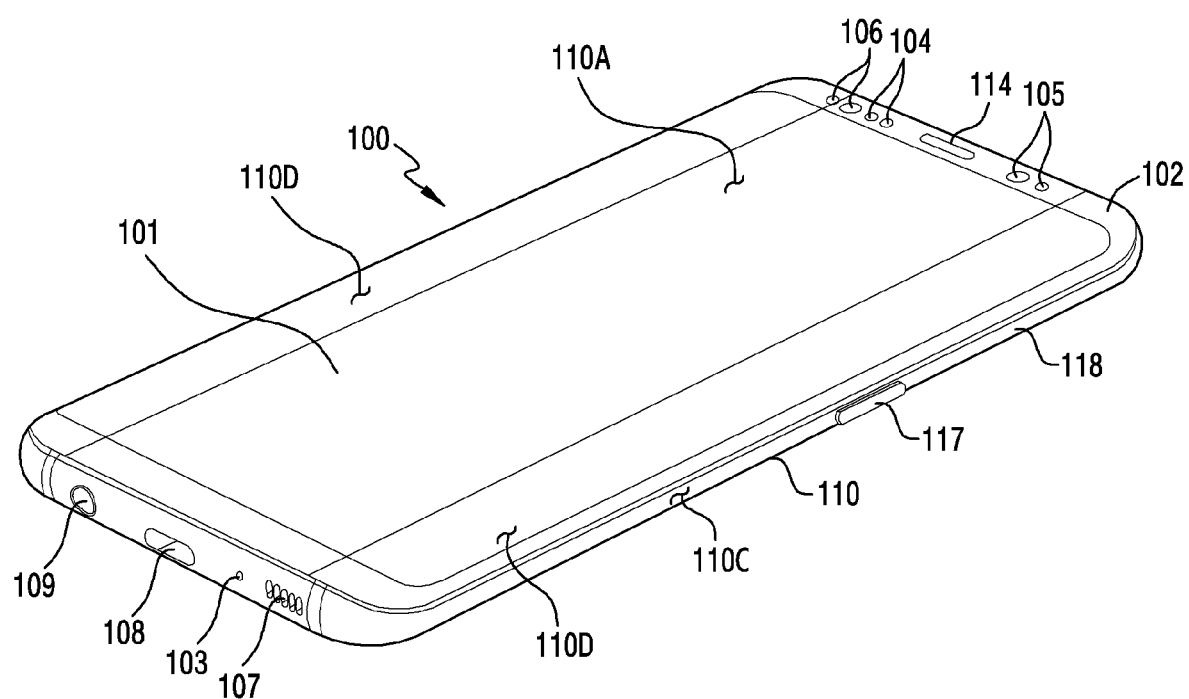
FIG. 1 is a perspective view illustrating a front face of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

An electronic device according to various embodiments of the disclosure may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

According to some embodiments, the electronic device may be a smart home appliance. The smart home appliance may include, for example, at least one of a TeleVision (TV), a Digital Versatile Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to other embodiments, the electronic device may include at least one of various medical devices (e.g., various portable medical measuring devices (e.g., a blood sugar measuring device, a heartrate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Positioning system (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, Point Of Sales (POS) of shops, and Internet of things (e.g., a light bulb, various sensors, an electric or gas meter, a sprinkler device, a fire alarm, a thermostat, a streetlamp, a toaster, a fitness equipment, a hot water tank, a heater, a boiler, etc.).

According to some embodiments, the electronic device may include at least one of furniture or part of buildings/constructions, an electronic board, an electronic signature receiving device, a projector, and various measurement machines (e.g., water supply, electricity, gas, propagation measurement machine, etc.). In various embodiments, the electronic device may be one or more combinations of the aforementioned various devices. According to some embodiments, the electronic device may be a flexible device. Further, the electronic device according to an embodiment of the disclosure is not limited to the aforementioned devices, and may include a new electronic device depending on technical progress.

Figure 2:
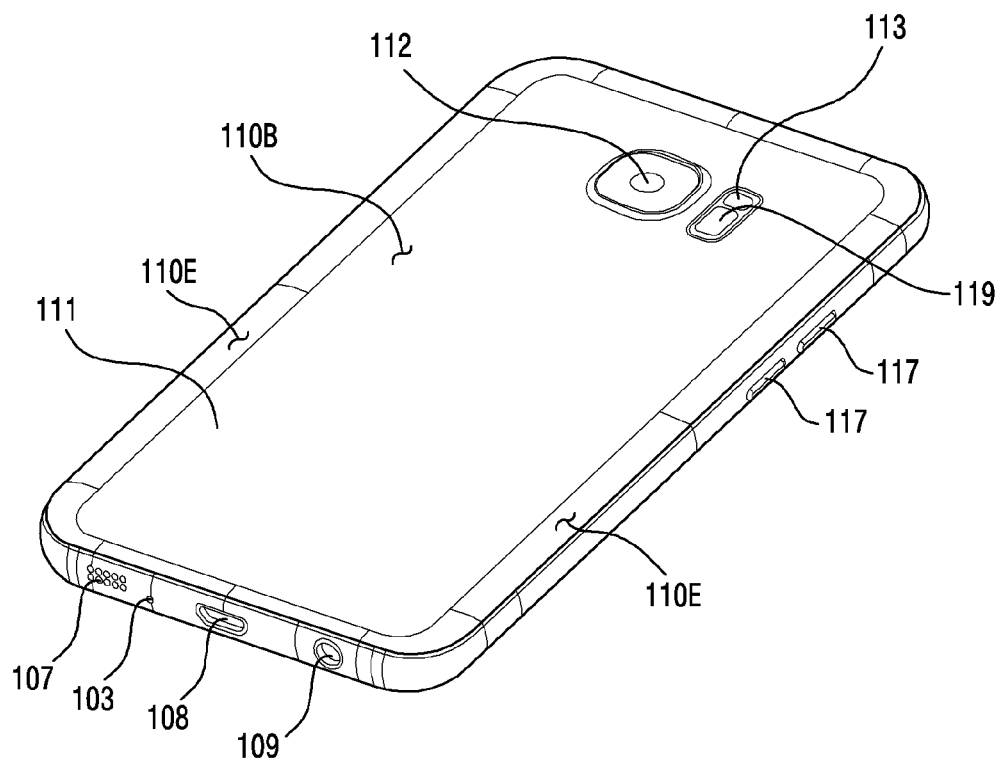
FIG. 2 is a perspective view illustrating a rear face of the electronic device of FIG. 1 according to an embodiment of the disclosure.

FIG. 1 is a perspective view illustrating a front face of an electronic device according to an embodiment of the disclosure. FIG. 2 is a perspective view illustrating a rear face of the electronic device of FIG. 1 according to an embodiment of the disclosure.

Referring to FIGS. 1 and 2, an electronic device 100 according to an embodiment may include a housing 110 including a first face (or a front face) 110A, a second face (or a rear face) 110B, and a side face 110C surrounding a space between the first face 100A and the second face 110B. In another embodiment (not shown), the housing 110 may refer to a construction which constitutes part of the first face 110A, second face 110B, and side face 110C of FIG. 1. According to an embodiment, the first face 110A may be constructed of a front plate 102 (e.g., a polymer plate or a glass plate including various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of these materials. The side face 110C may be constructed with a side bezel construction (or a side member) 118 bonded to the front plate 102 and the rear plate 111 and including metal and/or polymer. In some embodiments, the rear plate 111 and the side bezel construction 118 may be constructed integrally and may include the same material (e.g., a metallic material such as aluminum).

In the illustrated embodiment, the front plate 102 may include first regions 110D seamlessly extended by being bent from the first face 110A toward the rear plate 111 at both ends of a long edge of the front plate 102. In the illustrated embodiment (see FIG. 2), the rear plate 111 may include second regions 110E seamlessly extended by being bent from the second face 110B toward the front plate 102 at both ends of a long edge. In some embodiments, the front plate 102 or the rear plate 111 may include only one of the first regions 110D or the second regions 110E. In another embodiment, some of the first regions 110D or the second regions 110E may not be included. In the above embodiments, in a side view of the electronic device 100, the side bezel construction 118 may have a first thickness (or width) at a side face in which the first regions 110D or the second regions 110E is not included, and may have a second thickness thinner than the first thickness at a side face in which the first regions 110D or the second regions 110E is included.

According to an embodiment, the electronic device 100 may include at least one or more of a display 101, audio modules 103, 107, and 114, sensor modules 104 and 119, camera modules 105, 112, and 113, a key input device 117, an indicator 106, and connector holes 108 and 109. In some embodiments, the electronic device 100 may omit at least one of components (e.g., the key input device 117 or the indicator 106), or other components may be additionally included.

The display 101 may be exposed through, for example, some portions of the front plate 102. In some embodiments, at least part of the display 101 may be exposed through the first face 110A and the front plate 102 constructing the first regions 110D of the side face 110C. In some embodiments, a corner of the display 101 may be constructed to have substantially the same shape as an outer boundary adjacent to the front plate 102. In another embodiment (not shown), in order to expand an area in which the display 101 is exposed, the display 101 and the front plate 102 may be constructed to have substantially the same interval between outer boundaries thereof.

In another embodiment (not shown), part of a screen display region of the display 101 may have a recess or opening, and may include at least one or more of the audio module 114, sensor module 104, camera module 105, and indicator 106 which are aligned with the recess or the opening. In another embodiment (not shown), at least one of the audio module 114, the sensor module 104, the camera module 105, a fingerprint sensor (not shown), and the indicator 106 may be included in a rear face of the screen display region of the display 101. In another embodiment (not shown), the display 101 may be disposed adjacent to or joined with a touch sensing circuit, a pressure sensor capable of measuring touch strength (pressure), and/or a digitizer for detecting a magnetic-type stylus pen. In some embodiments, at least part of the sensor modules 104 and 119 and/or at least part of the key input device 117 may be disposed to the first regions 110D and/or the second regions 110E.

The audio modules 103, 107, and 114 may include a microphone hole 103 and speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker (e.g., a piezo speaker) may be included without the speaker holes 107 and 114.

The sensor modules 104 and 119 may generate an electrical signal or data value corresponding to an internal operational state of the electronic device 100 or an external environmental state. The sensor modules 104 and 119 may include, for example, a first sensor module 104 (e.g., a proximity sensor) and/or second sensor module (not shown) (e.g., a fingerprint sensor) disposed to the first face 110A of the housing 110, and/or a third sensor module 119 (e.g., a Heart Rate Monitoring (HRM) sensor) disposed to the second face 110B of the housing 110. The fingerprint sensor may be disposed not only to the first face 110A (e.g., the display 101) but also the second face 110B of the housing 110. The electronic device 100 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 105, 112, and 113 may include a first camera device 105 disposed to the first face 110A of the electronic device 100, a second camera device 112 disposed to the second face 110B, and/or a flash 113. The camera modules 105 and 112 may include one or more lenses, an image sensor, and/or an image signal processor.

The flash 113 may include, for example, a Light Emitting Diode (LED) or a xenon lamp. In some embodiments, two or more lenses (wide angle and telephoto lenses) and image sensors may be disposed to one face of the electronic device 100.

The key input device 117 may be disposed to the side face 110C of the housing 110. In another embodiment, the electronic device 100 may not include the entirety or part of the aforementioned key input device 117. The key input device 117, which is not included, may be implemented on the display 101 in a different form such as a soft key or the like.

The indicator 106 may be disposed, for example, to the first face 110A of the housing 110. The indicator 106 may provide, for example, state information of the electronic device 100 in an optical form, and may include an LED.

The connector holes 108 and 109 may include a first connector hole 108 capable of housing a connector (e.g., a USB connector) for transmitting/receiving power and/or data with respect to an external electronic device and/or a second connector hole (e.g., earphone jack) 109 capable of housing a connector for transmitting/receiving an audio signal with respect to the external electronic device.

Figure 3:
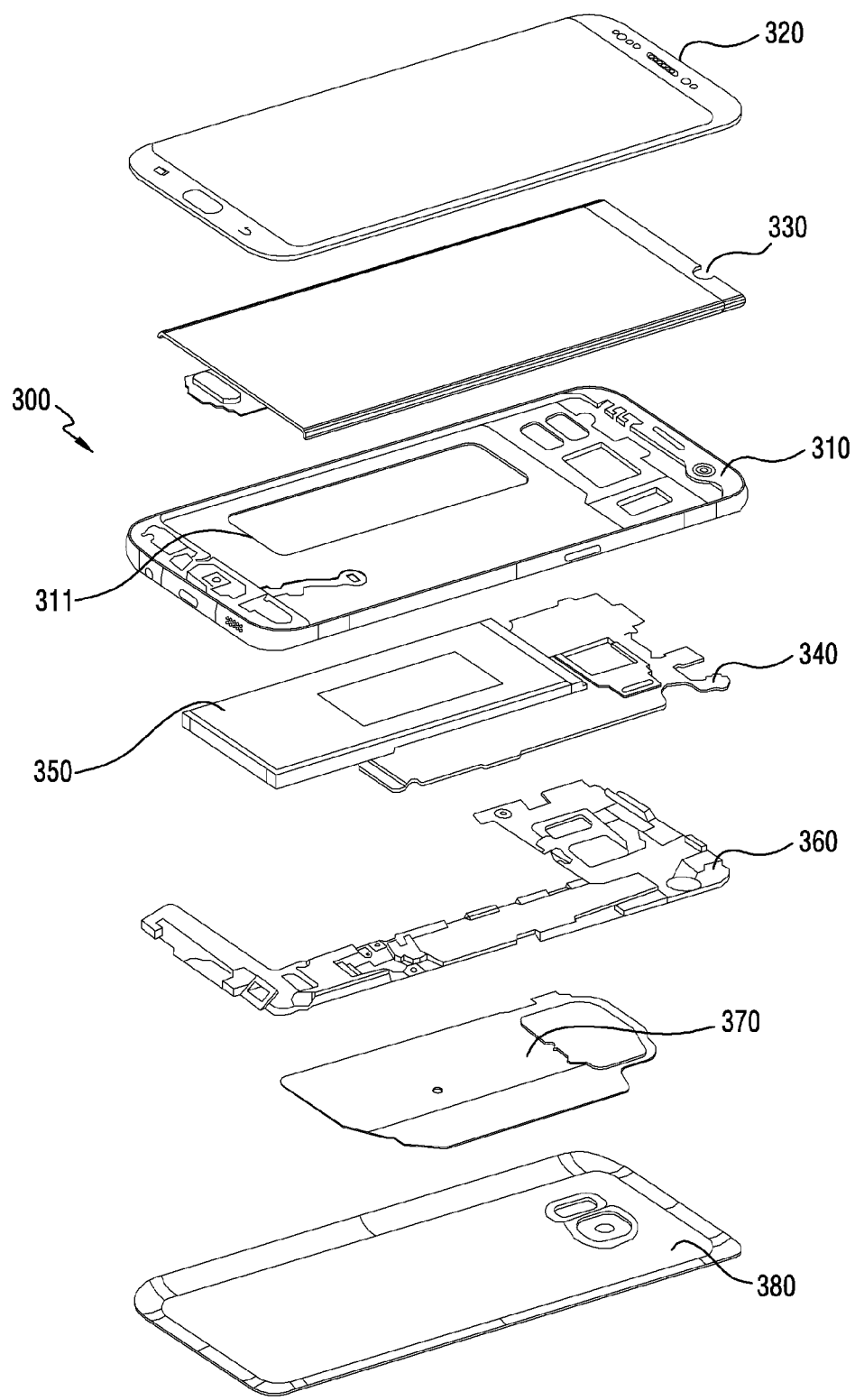
FIG. 3 is an exploded perspective view illustrating an internal structure of the electronic device of FIG. 1 according to an embodiment of the disclosure.

FIG. 3 is an exploded perspective view illustrating an internal structure of the electronic device of FIG. 1 according to an embodiment of the disclosure.

Referring to FIG. 3, an electronic device 300 may include a side bezel construction 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311 or the second support member 360) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the side bezel construction 310 by being disposed inside the electronic device 300, or may be constructed integrally with respect to the side bezel construction 310. The first support member 311 may be constructed of, for example, a metallic material and/or non-metallic material (e.g., polymer). The display 330 may be bonded to one face of the first support member 311, and the printed circuit board 340 may be bonded to the other face thereof. A processor, a memory, and/or an interface may be mounted on the printed circuit board 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/Multimedia Card (MMC) connector, or an audio connector.

As a device for supplying power to at least one component of the electronic device 300, the battery 350 may include, for example, a non-rechargeable primary cell, a rechargeable secondary cell, or a fuel cell. At least part of the battery 350 may be disposed on the same plane substantially with respect to, for example, the printed circuit board 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform short-range communication, for example, with the external electronic device, or may wirelessly transmit/receive power which is used for charging. In another embodiment, an antenna construction may be constructed by at least part of the side bezel construction 310 and/or the first support member 311 or a combination thereof.

Figure 4:
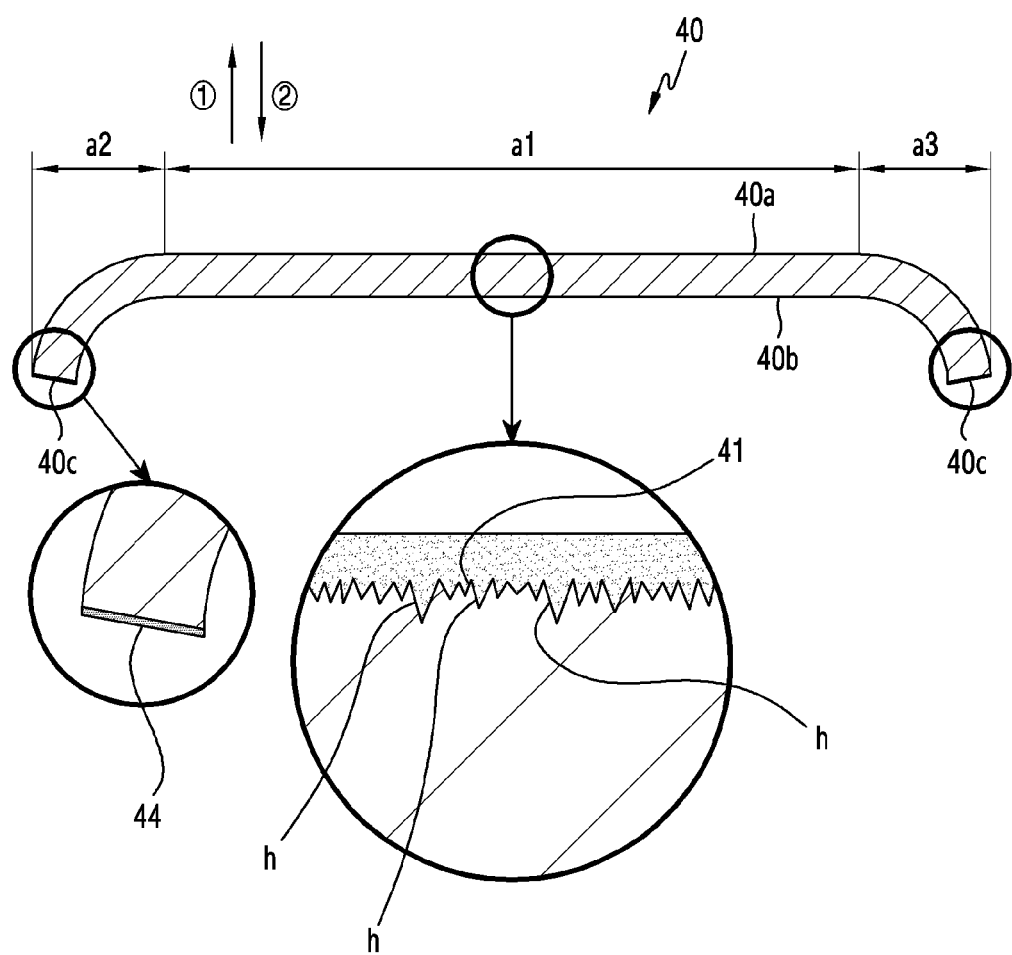
FIG. 4 is an enlarged cross-sectional view illustrating part of a structure of a surface-treated rear cover according to an embodiment of the disclosure.

FIG. 4 is an enlarged cross-sectional view illustrating part of a structure of a surface-treated rear cover according to an embodiment of the disclosure.

Referring to FIG. 4, a cover according to an embodiment may be the same as a rear plate 111 of FIG. 2. Although not shown in the figure, a cover according to another embodiment may refer to an external cover. Hereinafter, the cover is referred to as a rear cover. According to an embodiment, the rear cover may include a glass substrate 40. According to an embodiment, the glass substrate 40 may include a first face 40a, a second face 40b, and a side face 40c. According to an embodiment, the first face 40a may be a surface facing a first direction ①, the second face 40b may be a surface facing a second direction ② opposite to the first direction ①, and the side face 40c may be at least one surface disposed between the first and second faces 40a and 40b.

According to an embodiment, the glass substrate 40 may be manufactured in a 3D shape by using a thermoforming technique, for example, a pair of upper and lower molds. For example, the 2D glass substrate 40 may be transformed into the 3D glass substrate 40 via the molds. According to an embodiment, the glass substrate 40 transformed to the 3D shape may include a flat portion a1 including at least one edge and first and second curved portions a2 and a3 extended from the edge of the flat portion a1. The first and second curved portions a2 and a3 may be formed at both edges of the flat portion a1. The first and second curved portions a2 and a3 may have respective curvatures.

According to an embodiment, the rear cover may have a roughness layer 41 and hairline pattern h formed on the first face 40a. For example, the hairline pattern h may be formed on the first face 40a or the second face 40b. According to an embodiment, the rear cover may include the roughness layer 41 formed on the first face 40a of the glass substrate 40, and may include the hairline pattern h and a hard coating layer 42. According to an embodiment, the roughness layer 41 may be formed on the first face 40a to provide a first roughness. For example, the first roughness may provide an irregular roughness property to the first face 40a. According to an embodiment, the first roughness may be formed by performing surface treatment on the first face 40a through blasting with a first fine metal particle. For example, the first fine metal particle may have a size of about 30 to 50 micrometers.

According to an embodiment, the first roughness may be formed using a chemical etching process to provide a roughness property to the first face 40a. For example, the chemical etching process may be performed using any one of hydrofluoric acid, nitric acid, sulfuric acid, and ammonium nitride.

According to an embodiment, the glass substrate 40 may have the hairline pattern h formed on the roughness layer 41. According to an embodiment, a manufacturing process for forming a hairlines texture on the rear cover may be performed before forming the hairline pattern since the blasting process or the chemical etching process has difficulty in representing the hairline texture using a sandpaper due to slippery of the glass surface. The blasting process or the chemical etching process may deteriorate a gloss of the glass surface, and may deteriorate a sliding property.

According to an embodiment, the hairline pattern h may provide a second roughness. According to an embodiment, the second roughness may be formed on the roughness layer 41 by using a sandpaper.

According to an embodiment, the hard coating layer 42 may be formed on the roughness layer 41 and the hairline pattern h (e.g., in the first direction ①). For example, the hard coating layer 42 may provide a high hardness property as an outermost layer of the rear cover. For example, the hard coating layer 42 may be an Anti-Fingerprint (AF) layer or an Anti-Smudge (AS) layer.

According to an embodiment, the glass substrate 40 may have a printed layer 43 further formed on the second face 40b. For example, the printed layer 43 may be formed by performing deposition using a chemical process or by attaching a colored sheet or film.

According to an embodiment, the glass substrate 40 may be replaced with a transparent polymer substrate.

Figure 5:
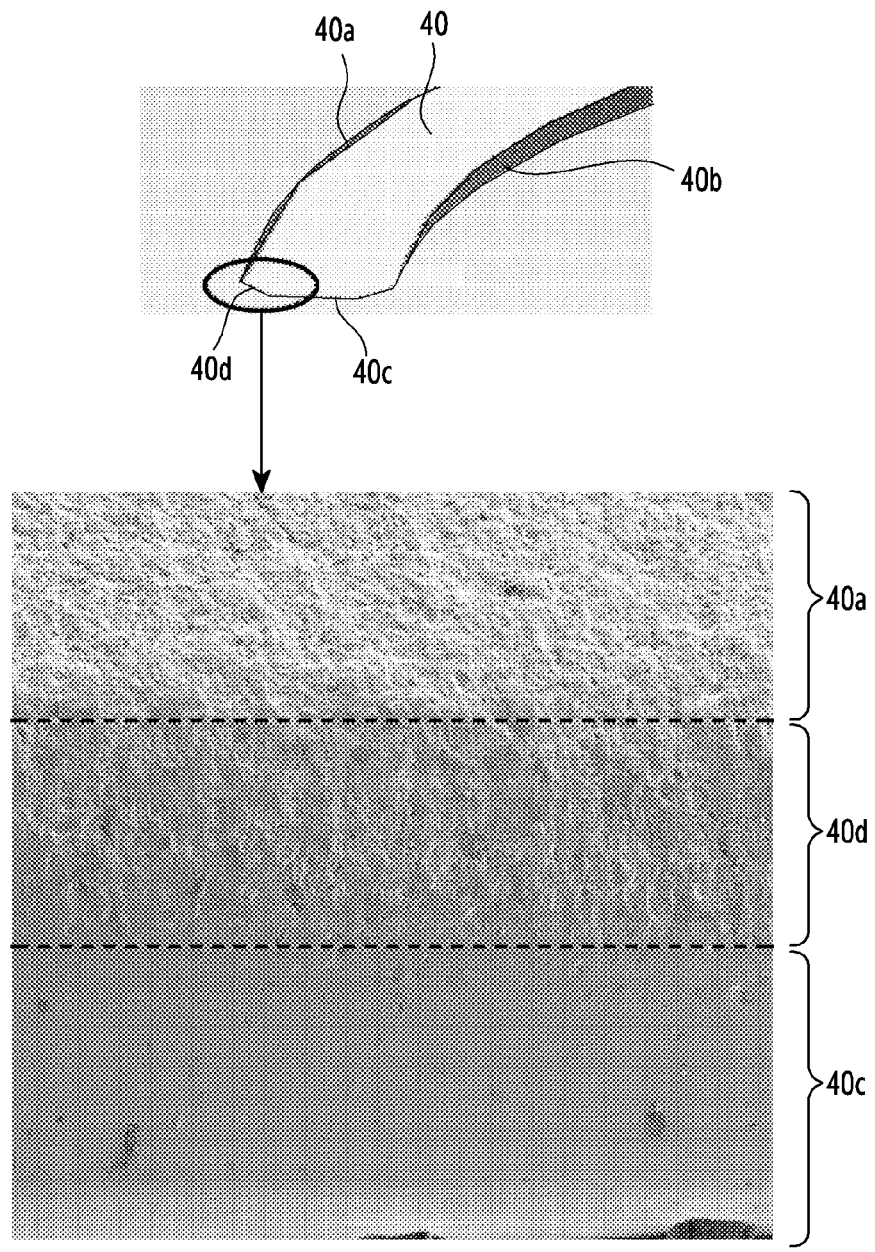
FIG. 5 is an enlarged photograph illustrating part of a side face of a rear cover according to an embodiment of the disclosure.

FIG. 5 is an enlarged photograph illustrating part of a side face of a rear cover according to an embodiment of the disclosure.

Referring to FIGS. 4 and 5, a side face 40c of the glass substrate 40 according to an embodiment may further include a light leakage suppressing layer 44. According to an embodiment, the rear cover may be an optical member since it is the glass substrate 40, and light transmitted from a display may be guided to the side face 40c of the electronic device and be leaked outwardly to the rear cover.

To prevent this, the rear cover may have the light leakage suppressing layer 44 formed on the side face 40c. According to an embodiment, the side face 40c of the rear cover may further include at least one chamfer portion 40d.

A process of manufacturing a rear cover according to an embodiment of the disclosure will be described with reference to FIGS. 6A, 6B, 7A, 7B, 7C, 8, 9, 10.

Figure 6A:
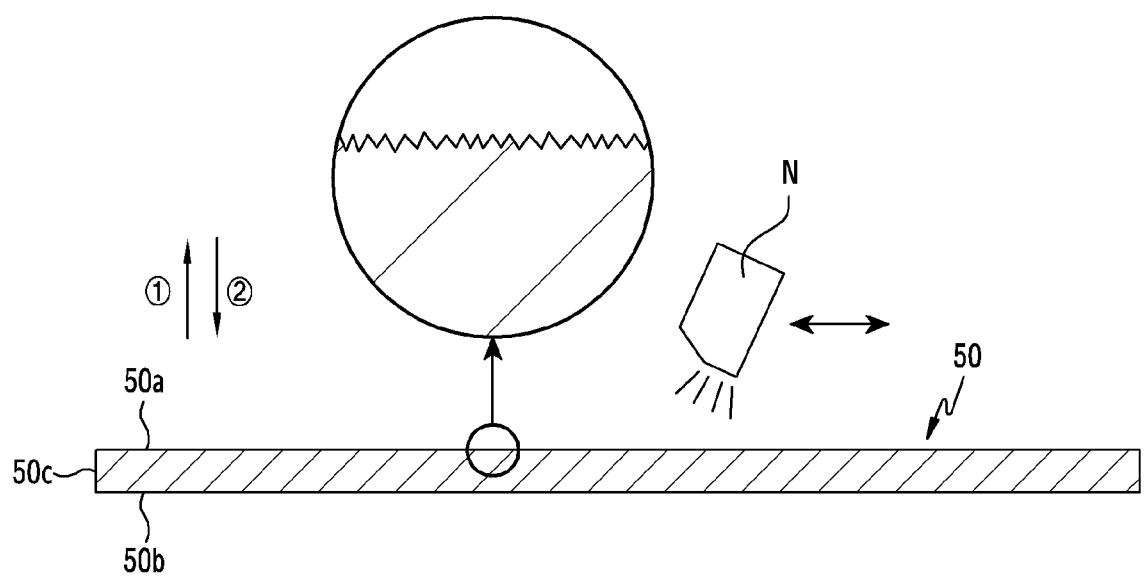
FIG. 6A is a diagram briefly illustrating a situation in which a blasting process is performed on a glass substrate according to an embodiment of the disclosure.
Figure 6B:
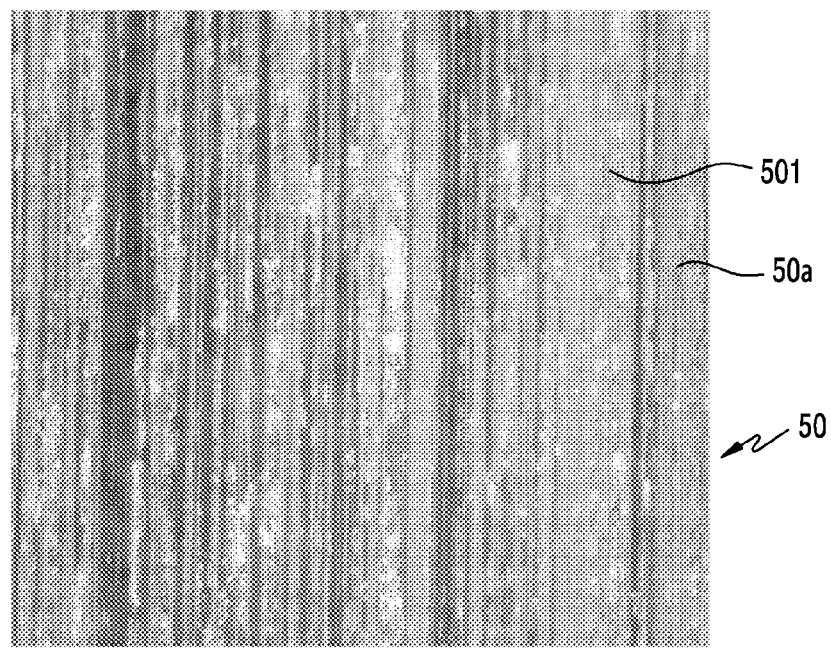
FIG. 6B is an enlarged photograph illustrating a state in which a roughness layer is formed on a glass substrate through a blasting process according to an embodiment of the disclosure.

FIG. 6A is a diagram briefly illustrating a situation in which a blasting process is performed on a glass substrate according to an embodiment of the disclosure. FIG. 6B is an enlarged photograph illustrating a state in which a roughness layer is formed on a glass substrate through a blasting process according to an embodiment of the disclosure.

Referring to FIG. 6A, a glass substrate 50 (e.g., a glass substrate 40 of FIG. 4) according to an embodiment may be prepared in a 2D shape as a transparent substrate. According to an embodiment, the prepared glass substrate 50 (i.e., a bare glass substrate) may include a first face 50a facing a first direction ①, a second face 50*b* facing a second direction ② opposite to the first direction ①, and a plurality of side faces 50*c* disposed between the first and second faces.

According to an embodiment, the first face 50*a* of the glass substrate 50 may be subjected to surface treatment by blasting a first fine metal particle from a spray nozzle of a blasting device N. According to an embodiment, the blasting device may roughen the smooth first face 50*a* while moving along the glass substrate 50. For example, FIG. 6B illustrates an enlarged microscopic photograph of the first face 50*a* of the glass substrate 50 subjected to the blasting surface treatment. While the blasted first fine metal particle rubs and collides on the first face 50*a* of the glass substrate, a rough layer such as a fine groove is irregularly formed on the first face 50*a*, thereby forming a roughness layer on the first face 50*a* including a first roughness on the first face 50*a*. For example, the first fine metal particle may have a size of about 30 to 50 micrometers, as alumina particles. According to an embodiment, the blasting process using the first fine metal particles may facilitate a hairline pattern realization process by using a sandpaper.

Figure 7A:
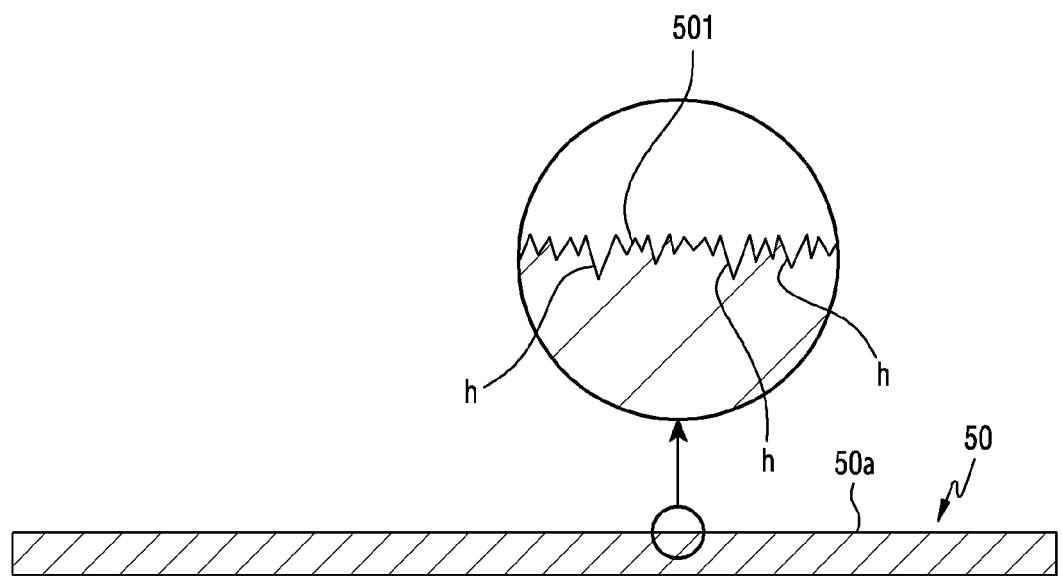
FIG. 7A is a partially enlarged cross-sectional view illustrating a state in which a hairline pattern is formed on a glass substrate according to an embodiment of the disclosure.
Figure 7B:
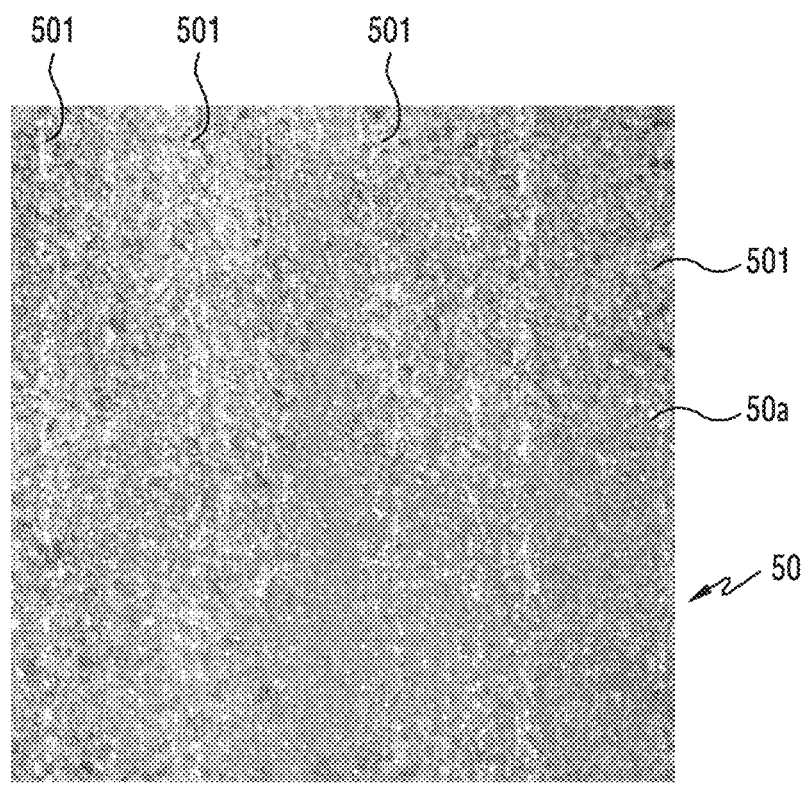
FIG. 7B is an enlarged photograph illustrating a state in which a hairline pattern is formed on a glass substrate according to an embodiment of the disclosure.
Figure 7C:
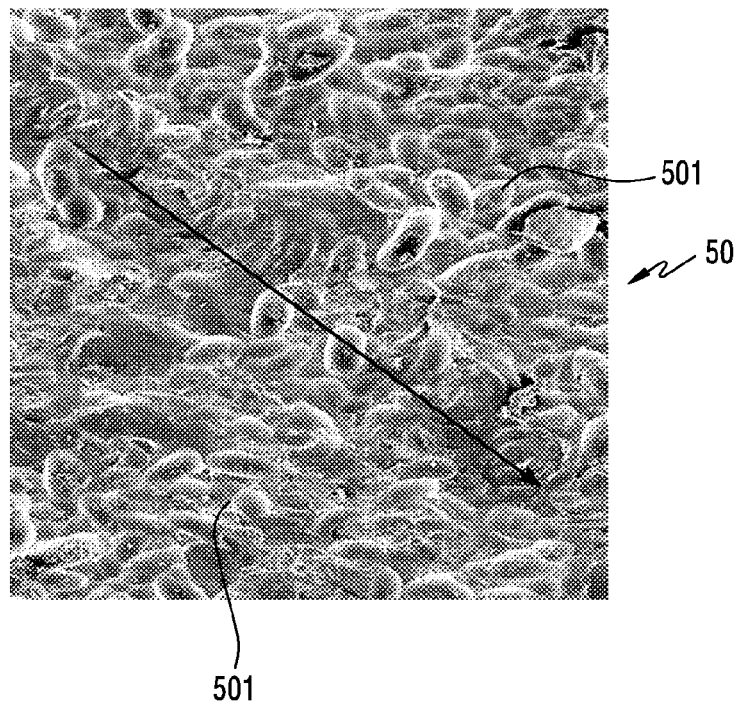
FIG. 7C is a further enlarged photograph of the hairline pattern of FIG. 7B according to an embodiment of the disclosure.

FIG. 7A is a partially enlarged cross-sectional view illustrating a state in which a hairline pattern is formed on a glass substrate according to an embodiment of the disclosure. FIG. 7B is an enlarged photograph illustrating a state in which a hairline pattern is formed on a glass substrate according to an embodiment of the disclosure. FIG. 7C is a further enlarged photograph of a hairline pattern of FIG. 7B according to an embodiment of the disclosure.

Referring to FIG. 7A, according to an embodiment, a glass substrate 50 on which the first roughness is formed may have a hairline pattern formed using a stick, a paper having a rough surface, or a metal instrument having a rough surface. For example, the stick may be constructed of a wood material, the paper having the rough surface may be a sandpaper, and the metal instrument having the rough surface may be a stick-shaped metal instrument having a fine concavo-convex shape. Hereinafter, the stick is referred to as the wood stick, and the paper having the rough surface is referred to as the sandpaper.

According to an embodiment, a hairline pattern h may be formed on a roughness layer 501 via the wood stick and the sandpaper (e.g., #50~300). For example, the hairline pattern h additionally formed on the roughness layer 501 may be formed irregularly. According to an embodiment, a process of forming the hairline pattern h may use a wet or dry scheme depending on preference.

According to an embodiment, the hairline pattern h may be formed on the first face 50*a* by rubbing the wood stick and the sandpaper about 3 to 5 times in one direction on the first face 50*a*. For example, a second roughness may be provided on the roughness layer 501 on which the hairline pattern h is formed, and the hairline pattern may be formed between fine grooves formed on the roughness layer 501 in a concave-convex shape. A photograph of the glass substrate 50 formed on the hairline pattern h on the first face 50*a* is illustrated in FIGS. 7B and 7C.

According to an embodiment, an outer boundary portion (e.g., edges) of the glass substrate 50 having the hairline pattern h formed thereon may be processed by using a computer numerical control (CNC) device. For example, when the hairline pattern h is formed on the glass substrate 50, the outer boundary portion may be damaged due to the sandpaper, and a CNC process may be performed to remove the damaged outer boundary portion.

Figure 8:
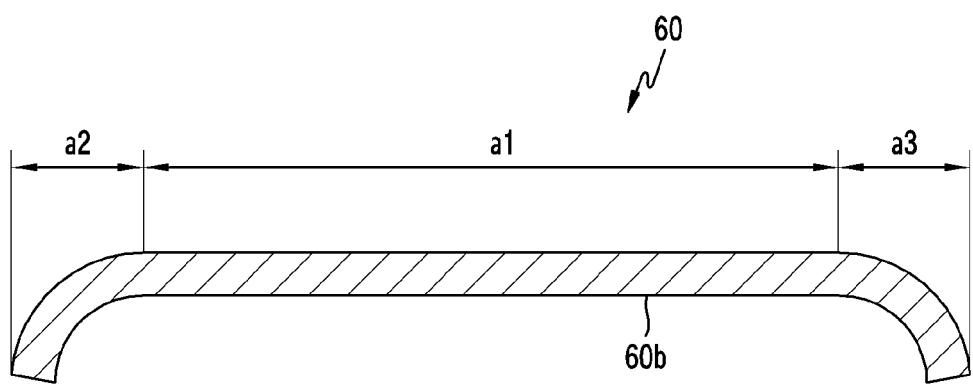
FIG. 8 is a cross-sectional view illustrating a 3D glass substrate according to an embodiment of the disclosure.

FIG. 8 is a cross-sectional view illustrating a 3D glass substrate according to an embodiment of the disclosure.

Referring to FIG. 8, according to an embodiment, a glass substrate 60 having a hairline pattern formed thereon (e.g., the hairline pattern h of FIG. 4) may be formed from a 2D shape to a 3D shape by using a thermoforming device. For example, the thermoforming device may include a mold device consisting of a pair of upper and lower molds. The 3D glass substrate 60 may be manufactured by pressing the upper and lower molds after the 2D glass substrate 60 is placed between the upper and lower molds. Heat may be applied in a process of pressing the glass substrate 60.

According to an embodiment, a process of forming the 3D glass substrate using the thermoforming device may be performed before the hairline pattern is formed. According to an embodiment, in a process of manufacturing a rear cover, the glass substrate in a 2D state may be subjected to a blasting process and a hairline forming process after the 3D glass substrate is formed using the thermoforming device. According to an embodiment, when the process of forming the 3D glass substrate is performed, an edge masking process is used to prevent damage to an edge portion of the 2D glass substrate, and an additional jig may be added.

For example, the process of manufacturing the rear cover may be performed in the order of an operation of preparing an edge of the 2D glass substrate by using a first CNC, an operation of forming the prepared 2D glass substrate to a 3D glass substrate, an operation of performing first blasting surface treatment on a first face of the 3D glass substrate, an operation of mounting a hairline edge protection jib to the 3D glass substrate, an operation of forming a hairline pattern on the first face of the 3D glass substrate subjected to the first blasting surface treatment, an operation of working using a second CNC for removing a camera hole or the like formed on the 3D glass substrate, an operation of polishing a second face of the 3D glass substrate, and an operation of coloring the polished second face of the glass substrate.

According to an embodiment, the 3D glass substrate 60 may include the flat portion a1 and at least one or more of the first and second curved portions a2 and a3. For example, the first and second curved portions a2 and a3 may include the first and second curved portions a2 and a3 formed at both edges, and the first and second curved portions a2 and a3 may have the same or different curvatures.

According to an embodiment, a second fine metal particle may be blasted using a blasting device (e.g., the blasting device N of FIG. 4) to remove a mold mark formed on the first face of the glass substrate 60 manufactured in the 3D shape. For example, the second fine metal particle for removing the mold mark may have a size of about 20 to 30 micrometers.

A polishing process may be performed on a second face 60*b* of the glass substrate 60 according to an embodiment. According to an embodiment, the glass substrate 60 may be subjected to the polishing operation to remove a pin hole of a molding device, which occurs in the thermoforming process, or to remove a mold toll mark and a stain.

According to an embodiment, after the polishing process, the glass substrate 60 may be subjected to a glass strengthening process. According to an embodiment, the glass substrate 60 may be subjected to the strengthening process by using a chemical method to improve strength and ductility of a hairline pattern (e.g., the hairline pattern h of FIG. 4). For example, the chemical method may be performed as a chemical etching process, and may use any one of materials of hydrofluoric acid, nitric acid, sulfuric acid, and ammonium nitride.

Figure 9:
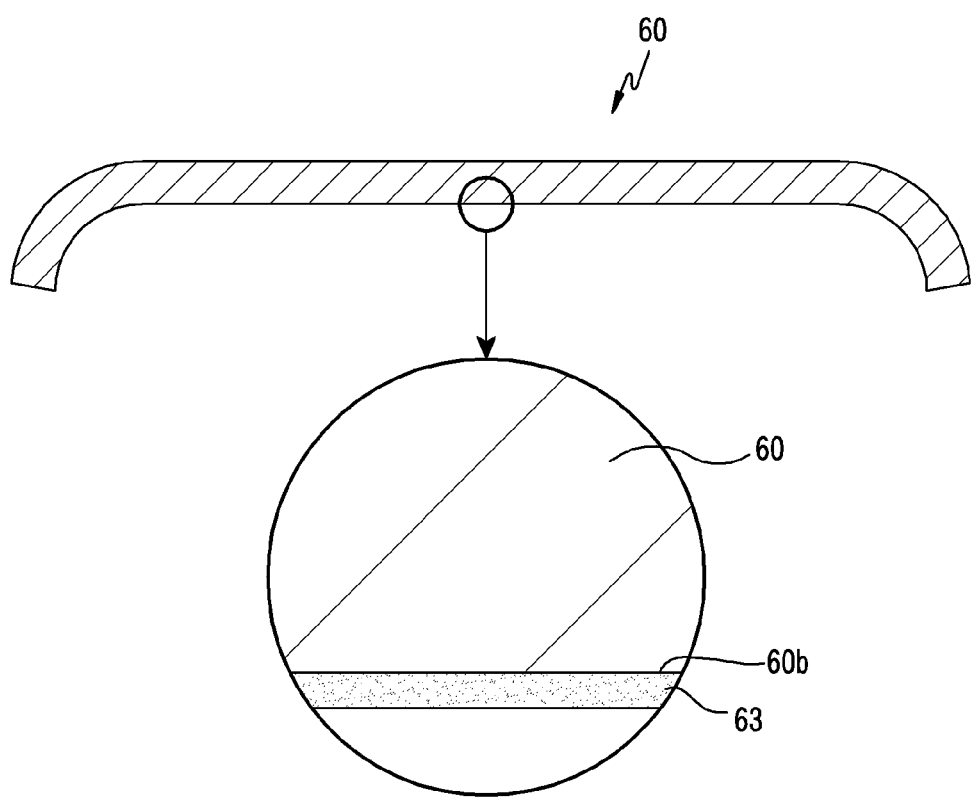
FIG. 9 is a partially enlarged cross-sectional view illustrating a state in which a printed layer is formed on a second face of a glass substrate according to an embodiment of the disclosure.

FIG. 9 is a partially enlarged cross-sectional view illustrating a state in which a printed layer is formed on a second face of a glass substrate according to an embodiment of the disclosure.

Referring to FIG. 9, a process of coloring a glass substrate 60 may be added after a polishing process. According to an embodiment, the glass substrate 60 may have a printed layer 63 disposed on a second face 60b. For example, the printed layer may be formed by coating color through a deposition process for applying color, or by attaching a colored film or by performing a Color Material Finishing (CMF) process. For example, the printed layer 63 may represent a metal texture of a rear cover.

Figure 10:
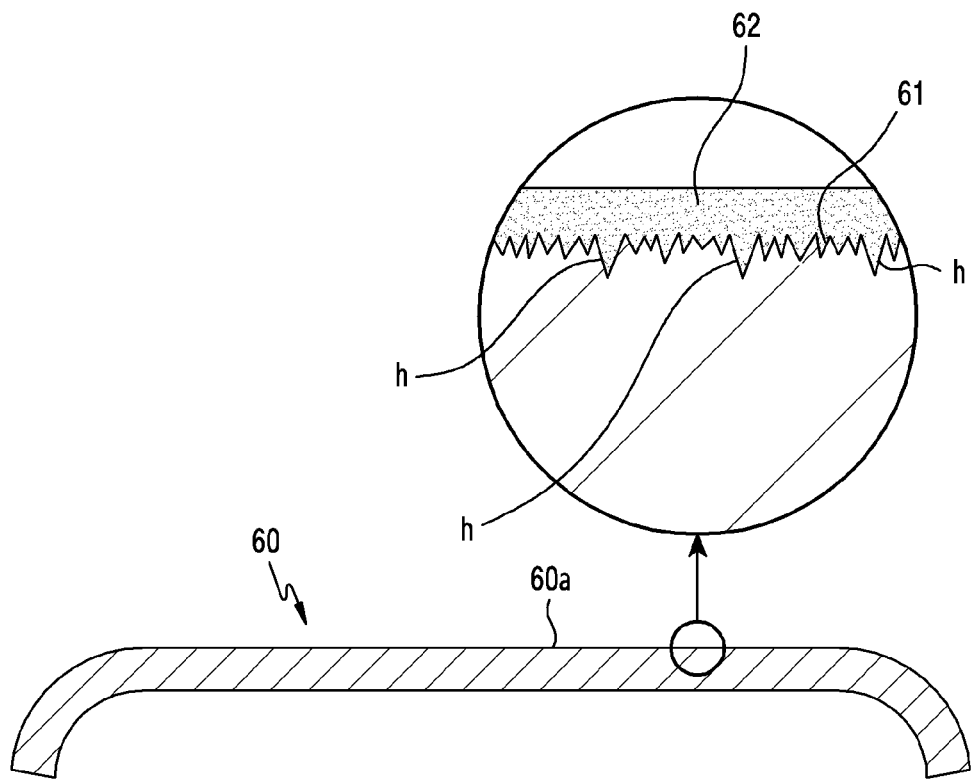
FIG. 10 is a partially enlarged cross-sectional view illustrating a state in which a coating layer is formed on a first face of a glass substrate according to an embodiment of the disclosure.

FIG. 10 is a partially enlarged cross-sectional view illustrating a state in which a coating layer is formed on a first face of a glass substrate according to an embodiment of the disclosure.

Referring to FIG. 10, a glass substrate 60 according to an embodiment may have a roughness layer 61 having a hairline pattern h formed thereon, and a coating layer 62 may be further formed on the hairline pattern h. According to an embodiment, the coating layer 62 may be an outermost layer of the glass substrate 60, as an AF or AS coating layer. According to an embodiment, a process of forming the coating layer 62 may be a deposition process using either a wet scheme or a dry scheme. For example, the coating layer 62 may be the hard coating layer 62, as a protection layer for protecting the hairline pattern h and the roughness layer 61 formed on a first face 60a of the glass substrate 60. According to an embodiment, a process of forming the coating layer 62 on the glass substrate 60 may be performed before or after a process of coloring the glass substrate 60.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A rear cover of an electronic device, the rear cover comprising:
   a glass substrate; and
   a hard coating layer formed on a first face of the glass substrate,
   wherein the first face of the glass substrate comprises:
      a roughness layer formed on the first face of the glass substrate and including fine grooves formed irregularly, the fine grooves having irregular depths and widths,
      a hairline pattern formed irregularly between the fine grooves of the roughness layer and having irregular depths and widths, and
      wherein the hard coating layer is coated on the roughness layer and the hairline pattern.

2. The rear cover of claim 1,
   wherein the glass substrate is manufactured in a three dimensional (3D) shape using a thermoforming technique, and
   wherein the rear cover further comprises:
      a flat portion including at least one edge; and
      a covered portion extending from the at least one edge of the flat portion.

3. The rear cover of claim 1, wherein the first face is a front face or a rear face.

4. An electronic device comprising:
   a housing including at least one cover,
   wherein the at least one cover comprises:
      a glass substrate comprising:
         a first face facing a first direction,
         a second face facing a second direction opposite to the first direction, and
         at least one side face disposed between the first face and the second face, the at least one side face comprising a flat portion including at least one edge and a curved portion extending from the at least one edge of the flat portion, and
      a hard coating layer formed on the first face of the glass substrate,
   wherein the first face of the glass substrate comprises:
      a roughness layer formed on the first face of the glass substrate and including fine grooves formed irregularly, the fine grooves having irregular depths and widths,
      a hairline pattern formed irregularly between the fine grooves of the roughness layer and having irregular depths and widths, and
      wherein the hard coating layer is coated on the roughness layer and the hairline pattern.

5. The electronic device of claim 4, wherein a printed layer is formed on the second face.

6. The electronic device of claim 4, wherein the fine grooves are formed by fine metal particles being blasted to the first face of the glass substrate.

7. The electronic device of claim 6, wherein the hairline pattern is formed by polishing a portion of the first face of the glass substrate to which the fine metal particle has been blasted.

8. The electronic device of claim 4, wherein the hard coating layer is an anti-fingerprint (AF) layer or an anti-smudge (AS) layer.

9. The electronic device of claim 4, wherein the at least one side face further comprises a light leakage suppressing layer.

* * * * *